(12) United States Patent
Song

(10) Patent No.: US 7,030,673 B2
(45) Date of Patent: Apr. 18, 2006

(54) PHASE SPLITTER CIRCUIT

(75) Inventor: Ki-Whan Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 10/197,878

(22) Filed: Jul. 19, 2002

(65) Prior Publication Data

US 2003/0042959 A1   Mar. 6, 2003

(30) Foreign Application Priority Data

Sep. 6, 2001   (KR) ............................... 2001-54705

(51) Int. Cl.
  *H03K 11/26*   (2006.01)
(52) U.S. Cl. ...................... 327/258; 327/256; 327/259
(58) Field of Classification Search ................ 327/250, 327/256–259, 291, 293, 295, 415, 416; 326/85, 326/86, 87
  See application file for complete search history.

(56) References Cited

U.S. PATENT DOCUMENTS

| | | | |
|---|---|---|---|
| 4,255,723 A * | 3/1981 | Ebihara ................ 331/116 FE |
| 4,749,882 A * | 6/1988 | Morgan ..................... 327/170 |
| 4,782,253 A | 11/1988 | Shoji ........................... 326/17 |
| 4,791,326 A * | 12/1988 | Vajdic et al. ............... 327/391 |
| 5,459,437 A * | 10/1995 | Campbell ................... 331/111 |
| 5,682,123 A * | 10/1997 | Chau .......................... 331/57 |
| 5,751,176 A | 5/1998 | Sohn et al. ................ 327/295 |
| 5,867,043 A * | 2/1999 | Kim .......................... 327/257 |
| 6,420,920 B1 * | 7/2002 | Huber et al. ............... 327/257 |

* cited by examiner

*Primary Examiner*—Timothy P. Callahan
*Assistant Examiner*—An T. Luu
(74) *Attorney, Agent, or Firm*—Volentine Francos & Whitt

(57) ABSTRACT

A phase splitter circuit includes a first signal generator and a second signal generator. The first signal generator generates a first signal in response to an input signal. The second signal generator generates a second signal in response to the input signal. The phase of the first signal is different from that of the first signal. In particular, the phase splitter circuit has a means that is capable of controlling the first and second signals such that transition times thereof are equal. As a result, the phase splitter circuit may fulfill not only delay matching of each element, but also equality of the transition times of output signals.

38 Claims, 11 Drawing Sheets

PHASE SPLITTER CIRCUIT

CROSS-REFERENCES TO RELATED APPLICATIONS

This application claims priority under 35 U.S.C. §119 from Korean Patent Application No. 2001-54705, filed on Sep. 6, 2001, the entirety of which is hereby incorporated by reference in their entirety.

FIELD OF THE INVENTION

The present invention relates to a semiconductor integrated circuit and, more particularly, to a phase splitter circuit.

BACKGROUND OF THE INVENTION

A phase splitter circuit is a widely used circuit that receives a clock signal and generates therefrom a pair of clock signals having a phase difference is 180° with respect to each other. For example, the phase splitter circuit has been used for controlling a switch of a pipeline and a double data rate signaling. An example of such a phase splitter circuit is disclosed in U.S. Pat. No. 4,782,253 entitled "HIGH SPEED MOS CIRCUITS". FIG. 1 is a circuit diagram showing the phase splitter circuit disclosed in the '253 Patent.

Referring to FIG. 1, a phase splitter circuit 10 comprises first and second logic paths (first and second signal transfer paths) A and B. The first logic path A includes three inverters 21, 22, and 23 that are connected in cascade between an internal node NO and an input node N3 of a load (denoted by L). The second logic path B includes a pair of inverters 31 and 32 that are connected in cascade between the internal node NO and an input node N5 of another load (also denoted by L). The loads L consist of inverters 24 and 33, respectively.

Generally, each of the inverters of the first and second logic paths A and B is formed by a PMOS transistor and an NMOS transistor. Electrical current paths (source-drain paths) of the PMOS transistor and the NMOS transistor are connected in cascade between first and second power lines VDD and VSS. Gates of the PMOS and NMOS transistors are connected in common to receive an input signal. As known in the art, the output of the inverter is thus varied at a terminal located at a node in the series path between the PMOS and NMOS transistors. The internal node NO is typically connected to a clock pad (not shown) of a semiconductor integrated circuit (for example, a processor, memory or the like), i.e., to a clock pulse source thereof.

The above-described characteristic of the phase splitter circuit is directly linked with performance of a system having the phase splitter circuit. In addition, the characteristic of the phase splitter circuit may be evaluated depending on skew, a rise/fall time, low power, and a layout area. In this connection, the term "skew" refers to a difference between times A and B, where the time A is a time taken when the clock signal, rclk, is transferred to the output node N3 from the internal node NO, and the time B is a time taken when the clock signal, rclk, is transferred to the output node N5 from the internal node NO. Also, the rise/fall time determines whether transition waveforms of the clock signals clk and clkb, provided to loads 33 & 24 respectively, are similar. If the clock signals clk and clkb make similar waveforms, blocks using the clock signals clk and clkb as synchronous signals are guaranteed to exhibit a stable operating characteristic.

According to the above-mentioned '253 Patent, a delay matching method is used for improving the characteristic of the phase splitter circuit. The delay matching method is an application of the following principle. If the PMOS and NMOS transistors are designed such that delay elements are matched while matching delay times of the first and second logic paths A and B, the phase splitter circuit may obtain a stable characteristic with respect to process, voltage, and temperature variations (hereinafter referred to as "PVT variations"). Therefore, one advantage of such a delay matching method is that the phase splitter circuit is guaranteed to exhibit a robust characteristic, even though the PMOS and NMOS transistors are designed such that electrical characteristics thereof are contrary to each other.

According to the delay matching method, the sum Tup of pull-up delay times in the second logic path B is equal to the sum Tup of pull-up delay times in the first logic path A. Likewise, the sum Tdown of pull-down delay times in the second logic path B is equal to the sum Tdown of pull-down delay times in the first path A. As a result, the phase splitter circuit may be optimized with respect to the PVT variations. In this connection, a total delay time Td in the second logic path B is equal to Tup+Tdown. Similarly, a total delay time Td' in the first logic path A is equal to Tup+Tdown. Under such matching conditions, the phase splitter circuit may be optimized with respect to the PVT variations, and a skew characteristic of the phase splitter circuit may be improved. However, the waveform mismatching between the clock signals clk and clkb cannot be adjusted by the phase splitter circuit as shown in FIG. 1 (Alternatively, the phase splitter circuit is not capable of adjusting the waveform matching between the clock signals clk and clkb). This will be described more specifically hereinbelow.

FIG. 2 shows the waveforms of the signals that are varied at each node of the phase splitter circuit shown in FIG. 1. In FIG. 2, time t1 is a pull-down time of an output signal of an inverter 31 (or a pull-down delay time of the inverter 31), and time t2 is a pull-up time of an output signal of an inverter 32 (or a pull-up delay time of the inverter 32). Time t3 is a pull-up time of the output signal of the inverter 31, and time t4 is a pull-down time of the output signal of the inverter 32. Time t5 is a pull-down time of an output signal of an inverter 21, and time t6 is a pull-up time of an output signal of an inverter 22. Time t7 is a pull-down time of an output signal clkb of an inverter 23. Also, time t8 is a pull-up time of the output signal of the inverter 21, and time t9 is a pull-down time of the output signal of the inverter 22. Time t10 is a pullup time of the output signal of the inverter 23.

In order to match pull-up times of the clk and clkb signal paths according to the delay matching method of the '253 Patent, the time t2 should be equal to the time t6, and the time t3 should be equal to the time (t8+t10). Likewise, in order to match pull-down times of the clk and clkb signal paths according to the delay matching method of the '253 Patent, the time t1 should be equal to the time (t5+t7), and the time t4 should be equal to the time t9. The above-mentioned conditions are optimum conditions for guaranteeing a stable skew characteristic and a stable duty characteristic with respect to the PVT variations.

In order to satisfy the equations t1=t5+t7 and t2=t6, the delay time t1 of the inverter 31 should equal the sum of the delay times 21 and 23, i.e., t5+t7, and the delay time t2 of the inverter 32 should equal the delay time t6 of the inverter 22. Under such conditions, the delay time t1 of the inverter 31 should be set to be much longer than each of the delay times t5 and t7 of the inverters 21 and 23 so that the delay time t1 of the inverter 31 may be equal to the sum of the delay times t5 and t7 of the inverters 21 and 23. In this respect, the inverter 31 should be designed such that an output loading capacitance of the inverter 31 is much larger than each output loading capacitance of the inverters 21 and 23. The output loading capacitance of the inverter 31 may be increased by an increase in a size of the inverter 32. However, as gate widths of transistors in the inverter 32 become excessively larger to increase the output loading capacitance of the inverter 31, a driving capacity of the inverter 32 also excessively increases. As a result, as shown in FIG. 2, the waveform (or transition slope) of the clock signal clk is sharply varied as compared with the waveform (or transition slope) of the clock signal clkb.

For reference, it is possible to use other techniques for increasing the output loading capacitance of the inverter 31. For example, gate lengths of the transistors in the inverter 32 may be increased. Alternatively, another capacitor may be added at the node N4. However, as a result of using such other techniques, the delay time t2 of the inverter 32 may be excessively increased. In this case, the delay matching of each element cannot be fulfilled.

In order to increase the delay time, there may be used an inverter circuit of which the pull-up and pull-down times are set by the PMOS and NMOS transistors. Such an inverter circuit is disclosed in U.S. Pat. No. 5,751,176 entitled "CLOCK GENERATOR FOR GENERATING COMLEMENTARY CLOCK SIGNALS WITH MINIMAL TIME DIFFERENCES". However, the inverter circuit disclosed in U.S. Pat. No. 5,751,176 departs from the condition of the delay matching method of each element.

For this reason, as shown in FIG. 2, the rising/falling time tr_clk/tf_clk of the clock signal clk is shorter than the rising/falling time tr_clkb/tf_clkb of the clock signal clkb. As described above, since the output signals clk and clkb of the phase splitter circuit have different transition slopes, blocks or circuits using the output signals clk and clkb as the synchronous signals cannot exhibit stable operating characteristics. As a result, the system may suffer from deterioration of its performance.

FIGS. 3A and 3B are diagrams showing changes of the characteristics of the phase splitter circuit according to the PVT variations. FIG. 3C is a diagram showing variation of consumed currents of the phase splitter circuit according to the prior art.

In FIG. 3A, "ff", "tt", "ss", "fs", and "sf" are different process conditions. That is, "ff" is a process condition of a fast NMOS transistor and a fast PMOS transistor, and "tt" is a process condition of a typical NMOS transistor and a typical PMOS transistor. "ss" is a process condition of a slow NMOS transistor and a slow PMOS transistor, "fs" is a process condition of a fast NMOS transistor and a slow PMOS transistor, and "sf" is a process condition of the slow NMOS transistor and the fast PMOS transistor.

In this connection, the fast transistor, the slow transistor, and the typical transistor are divided according to a threshold voltage (or a saturation current: Id.sat) of each transistor.

Continuously, "Vdd_max" is about 2.626V; "Vdd_nom" is about 2.5V; and "Vdd_min" is about 2.25V. The skews between the clock signals clk and clkb when the clock signal rclk makes a low-to-high or high-to-low transition are denoted as "f_skew" and r_skew" respectively. As shown in FIG. 3A, when the PVT variations are varied as described above, the skew between the clock signals clk and clkb is controlled within ±13 ps (picosecond).

Referring to FIG. 3B, "tr/f_clk" is the rise/fall time of the clock signal clk, and "tr/f_clkb" is the rise/fall time of the clock signal clkb. As shown in FIG. 3B, there is a big gap between the rise/fall transition time of the clock signal clk and the rising/falling transition time of the clock signal clkb. Under typical test conditions, whereas the transition time (illustrated as solid lines) of clock signal clkb is about 170 ps, the transition time (also illustrated as solid lines) of the clock signal clk is only about 110 ps. For this reason, the clock signal clk generated through the second logic path has a much sharper waveform (or transition slope) as compared with that of the clock signal clkb generated through the first logic path. In other words, as shown in FIG. 3B, the transition time tr/f_clk of the clock signal clk is less than 50% of the transition time tr/f_clkb of the clock signal clkb with respect to all the PVT variations. As a result, sensitive analog circuits may suffer from severe deterioration of their characteristics.

In conclusion, according to the prior art, since the waveform matching characteristic between the output signals clk and clkb cannot be adjusted, it is impossible to optimize the phase splitter circuit. That is, the phase splitter circuit according to the prior art is not structurally capable of fulfilling both a delay matching characteristic of each element and balance of the transition time between the clock signals clk and clkb.

SUMMARY OF THE INVENTION

The present invention is directed at providing a phase splitter circuit that exhibits a robust characteristic with respect to process, voltage, and temperature variations (PVT variations).

The present invention is also directed at providing a phase splitter circuit that fulfills both delay matching of each element and equality of transition times of output signals.

The present invention provides a phase splitter circuit including first and second signal transfer paths. The first signal transfer path receives an input signal and generates a first output signal. The logic value of the first output signal is equal to that of the input signal. The second signal transfer path receives the input signal and generates a second output signal, an inverted version of the first output signal. Each of the first and second signal transfer paths includes logic elements connected in cascade. Each of the logic elements has pull-up and pull-down times. When the input signal makes a low-high transition, the sum of the pull-down delay times of the elements of the first signal transfer path is equal to the sum of the pull-down delay times of the elements of the second signal transfer path, and the transition time of the first output signal is equal to the transition time of the second output signal. Likewise, when the input signal makes a high-low transition, the sum of the pull-up delay times of the elements of the first signal transfer path is equal to the sum of the pull-up delay times of the elements of the second signal transfer path, and the transition time of the first output signal is equal to the transition time of the second output signal.

In this connection, each of the first and second signal transfer paths is formed by using a complementary-metal-oxide-semiconductor (CMOS) inverter and a current-starved inverter as logic elements.

The present invention also provides a phase splitter circuit including first and second signal generators. The first and second signal generators are connected in common to an input node. The first signal generator generates a first signal in response to the input signal applied to the input node. The second signal generator generates a second signal in response to the input signal. The phase of the second signal is different from that of the first signal.

In particular, the phase splitter circuit has an apparatus that is capable of controlling the first and second signals so that transition times thereof may be equal. Thus, the phase splitter circuit may fulfill not only delay matching of each element, but also equality of the transition times of the output signals.

Furthermore, the present invention also provides a phase splitter circuit comprising an input node, a first output node, and a second output node. A first signal generator generates a first internal clock signal in response to an external clock signal applied to the input node. The first signal generator comprises a first current-starved inverter and a CMOS inverter that are connected in cascade between the input node and the first output node. A second signal generator generates a second internal clock signal in response to the external clock signal applied to the input node. The second signal generator includes a second CMOS inverter, a second current-starved inverter, and a third CMOS inverter that are connected in cascade between the input node and the second output node. In this connection, each of the first and second current-starved inverters includes first and second PMOS transistors, and first and second NMOS transistors. The first and second PMOS transistors, and the first and second NMOS transistors are connected in cascade between first and second power lines in this order. Gate nodes of the first PMOS transistor and the second NMOS transistor are connected to a ground voltage and a power supply voltage, respectively so as to have delay time longer than that of a typical inverter. Alternatively, in order to obtain a desired delay time, the gate nodes may be driven by a voltage other than the ground voltage and the line voltage. The second PMOS transistor and the first NMOS transistor are connected in cascade between the first PMOS transistor and the second NMOS transistor to perform an inverting function.

The phase splitter circuit according to the present invention may fulfill not only the delay matching of each element, but also equality of the transition times of the output signals.

DESCRIPTION OF THE PREFERRED EMBODIMENT

The present invention will now be more fully described hereinafter with reference to the accompanying drawings, in which preferred embodiments of the invention are shown.

In order to optimize the phase splitter circuit with respect to process, voltage, and temperature (PVT) variations, delay times of delay elements (pull-up and pull-down elements) of the signal transfer paths should be equal. In addition, the phase splitter circuit should be designed such that transition times of the output signals clk and clkb are equal (or such that transition slopes of the output signals clk and clkb are equal). According to the delay matching method of the '253 Patent, whereas the delay times of the delay elements of the signal transfer paths can be equal, the transition times of the output signals clk and clkb cannot be equal. However, the phase splitter circuit as disclosed therein according to the present invention may structurally fulfill not only the delay matching of each element, but also equality of the transition times of the output signals. This will be more specifically described hereinafter.

Figure 4:
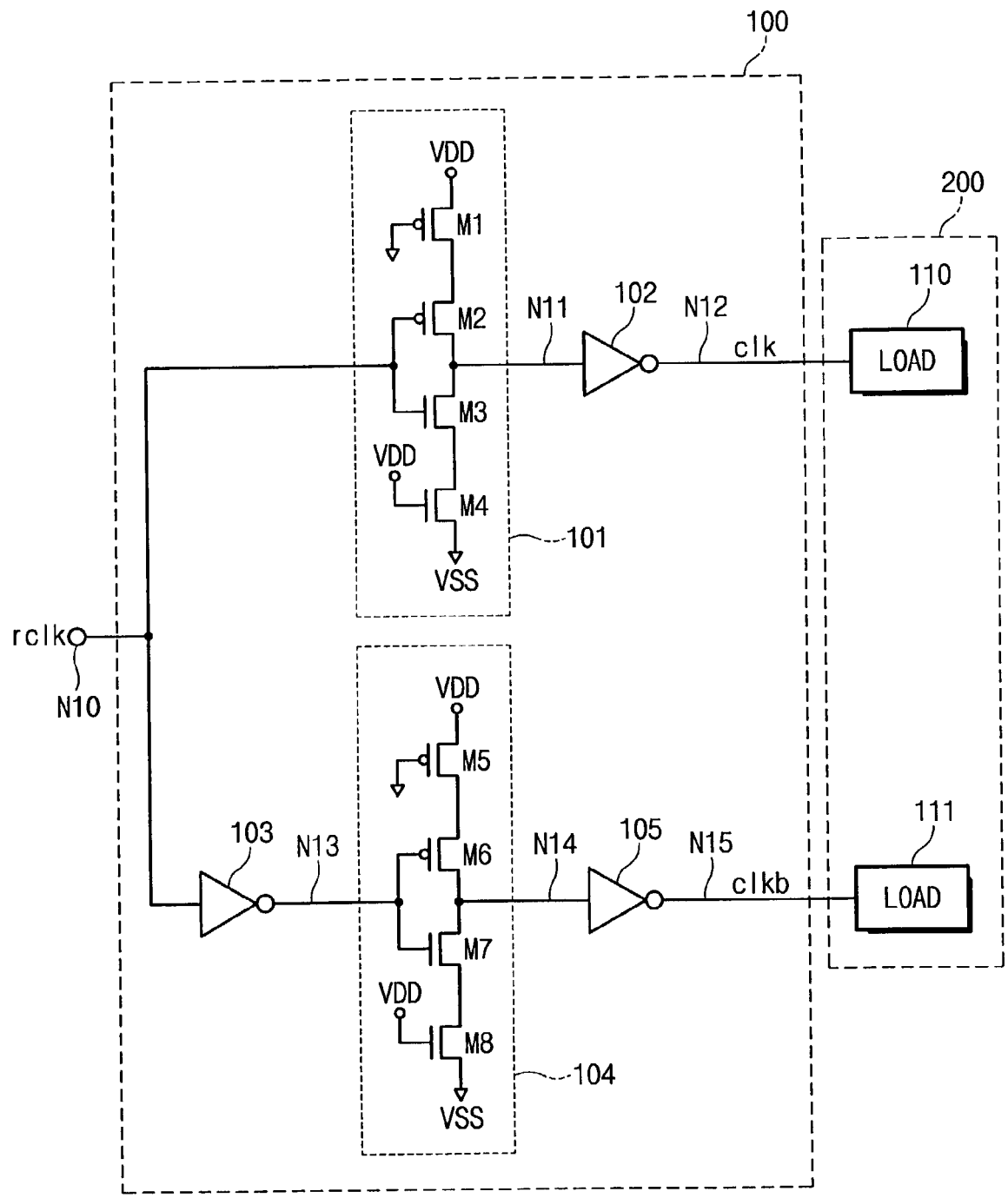
FIG. 4 is a circuit diagram showing a preferred embodiment of the phase splitter circuit in accordance to the present invention.
Figure 5:
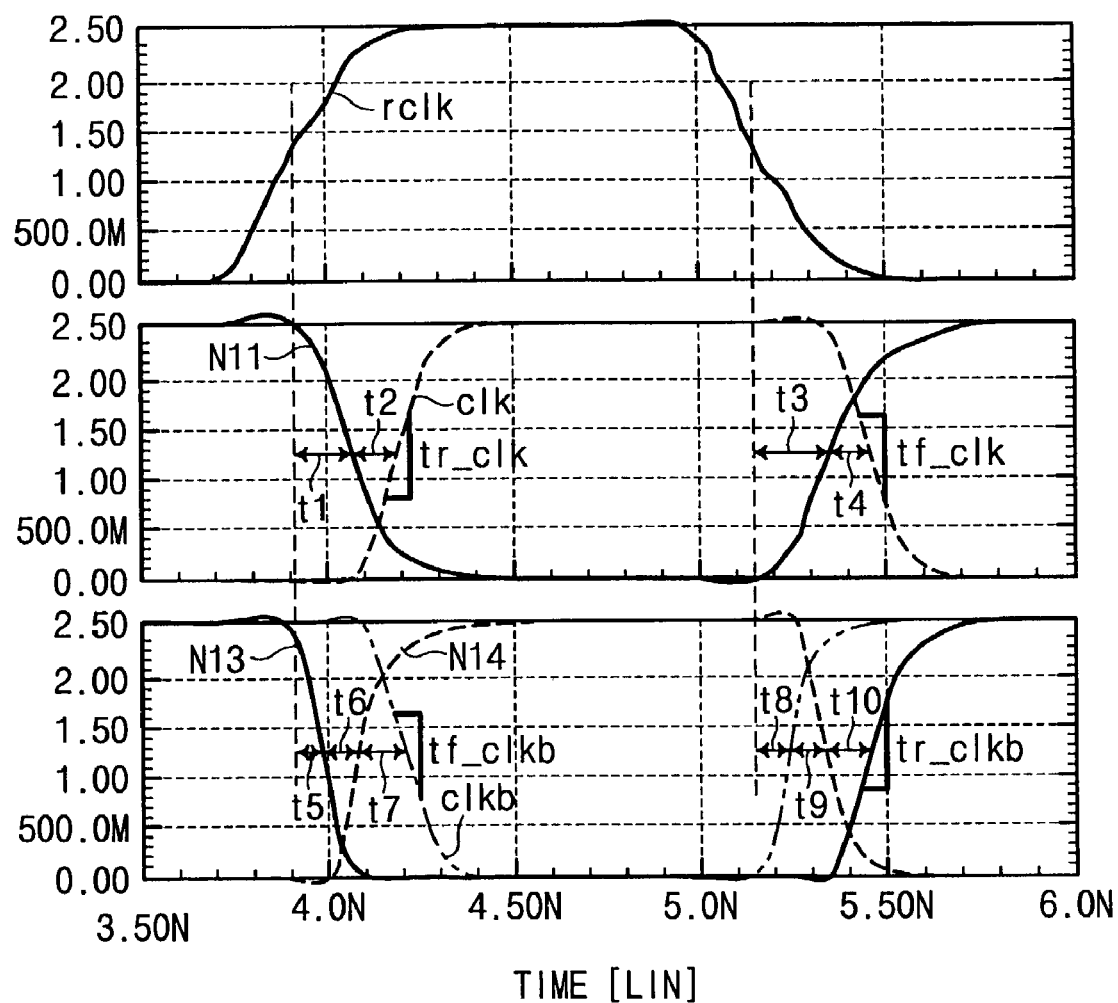
FIG. 5 is a diagram showing waveforms of signals that are varied at each node of the phase splitter circuit as shown in FIG. 4.

FIG. 4 is a circuit diagram showing a preferred embodiment of a phase splitter circuit. FIG. 5 is a diagram showing waveforms of signals that are varied at nodes of the phase splitter circuit as shown in FIG. 4. The phase splitter circuit 100 comprises first and second signal transfer paths. The phase splitter circuit 100 generates a pair of clock signals clk and clkb in response to a received clock signal rclk. The phase difference of the clock signals clk and clkb is 180°. The generated clock signals clk and clkb are transferred to an internal circuit 200, e.g., as synchronous signals.

Referring to FIG. 4, the first signal transfer path of the phase splitter circuit 100 comprises a pair of inverters 101 and 102 that are connected in cascade between an input node N10 and an output node N12. The output node N12 of the phase splitter circuit 100 is the input node of a load 110 of the internal circuit 200. The first signal transfer path generates the clock signal clk. The logic value of the clock signal clk is equal to that of the received clock signal rclk. The second signal transfer path of the phase splitter circuit 100 comprises three inverters 103, 104, and 105 that are connected in cascade between the input node N10 and another output node N15. The output node N15 of the phase splitter circuit 100 is the input node N15 of another load 120 of the internal circuit 200. The second signal transfer circuit generates the clock signal clkb. The logic value of the clock signal clkb is inverted from that of the received clock signal rclk. The phase difference of the clock signal clkb and the clock signal clk is 180°.

In FIG. 4, each of the inverters 102, 103, and 105 is formed by a CMOS inverter including PMOS and NMOS transistors. Each of the inverters 101 and 104 is embodied by a current-starved inverter.

As shown in FIG. 4, the current-starved inverter 101 of the first signal transfer path includes a pair of PMOS transistors M1 and M2 and a pair of NMOS transistors M3 and M4. The PMOS transistors M1 and M2 are connected in cascade between a power supply voltage terminal VDD and an output terminal N11 of the current-starved inverter 101. The NMOS transistors M3 and M4 are connected in cascade between the output terminal N11 of the current-starved inverter 101 and a ground voltage terminal VSS. A gate of the PMOS transistor M1 is connected to the ground voltage VSS, and a gate of the NMOS transistor M4 is connected to the power supply voltage VDD. The gates of the PMOS and NMOS transistors are connected in common to the input node N10.

Continuing to refer to FIG. 4, the current-starved inverter 104 of the second signal transfer path includes a pair of PMOS transistors M5 and M6 and a pair of NMOS transistors M7 and M8. The PMOS transistors M5 and M6 are connected in cascade between the power supply voltage terminal VDD and the output terminal N14 of the current-starved inverter 104. The NMOS transistors M7 and M8 are connected in cascade between the output terminal N14 of the current-starved inverter 104 and the ground voltage terminal VSS. A gate of the PMOS transistor M5 is connected to the ground voltage VSS, and a gate of the NMOS transistor M8 is connected to the power supply voltage VDD. The gates of the PMOS and NMOS transistors are connected in common to an internal node N13.

Figure 7:
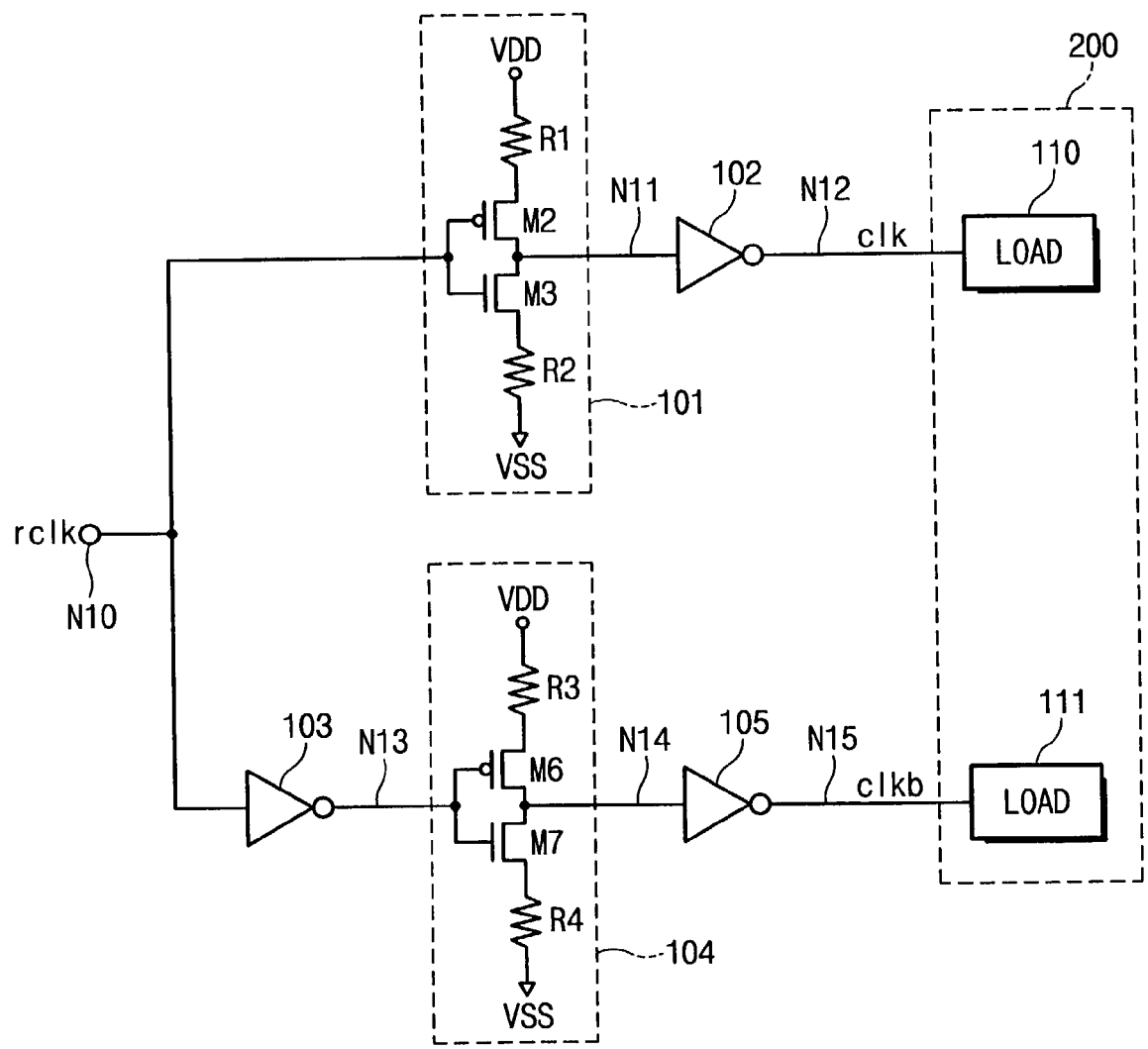
FIG. 7 is a circuit diagram showing the phase splitter circuit using a resistance as a delay element.

A phase splitter circuit having resistors instead of the PMOS transistors is illustrated in FIG. 7. The phase splitter circuit shown in FIG. 7 is substantially the same as the phase splitter circuit shown in FIG. 4, except for the PMOS transistors being replaced by resistors. Thus, the description thereof is omitted.

As mentioned above, the phase splitter circuit 100 can fulfill not only the delay matching of each element, but also equality of the transition times of the output clock signals. The principle will be more fully described hereinbelow. The transition times of the output clock signals can be made equal by increasing the delay time between the internal nodes N13 and N14. In order to increase the delay time between the internal nodes N13 and N14, as shown in FIG. 4, the current-starved inverter is used instead of a CMOS inverter. In this case, as the delay time between the internal nodes N13 and N14 is increased, it becomes possible to increase the delay time between the internal nodes N11 and N12 according to the delay matching condition. In order to increase the delay time between the internal nodes N11 and N12, the size of the inverter 102 may be reduced to increase a charge/discharge time of the first output loading capacitance of the phase splitter circuit. As a result, the phase splitter circuit is optimized so that, the transition time of the output clock signal clk may be increased to equal that of the output clock signal clkb. In addition, the delay matching of each element may be completely fulfilled by undergoing the following steps.

While reducing the size of the inverter 102, if the delay time of the inverter 101 is reduced with a decrease in the loading capacitance of the internal node N11, the pull-down matching condition may be unfulfilled in the delay matching method of each element. To solve such a problem, a current-starved inverter 101 is used instead of the CMOS inverter of the first signal transfer path. That is, the delay time reduction caused by a decrease in a fan-out loading of the inverter 101 may be compensated by a delay time increase caused by using the current-starved inverter 101.

In conclusion, the phase splitter circuit 100 shown in FIG. 4 can fulfill the delay matching conditions of the pull-up and pull-down elements (with reference to FIG. 5, the pull-up matching condition is t2=t6 and t3=t8+t10, and the pull-down matching condition is t1=t5+t7 and t4=t9), and also fulfill equality of the transition times of the output clock signals clk and clkb.

The method of using the current-starved inverter for increasing the delay time does not depart from a major premise of the delay matching method of each element. The major premise is that the pull-up and pull-down times are set by the PMOS and NMOS transistors, respectively. In this respect, another advantage of the disclosed phase splitter circuit is that it is possible to fulfill the condition that the pullup and pull-down times are set by the PMOS and NMOS transistors.

Figure 1:
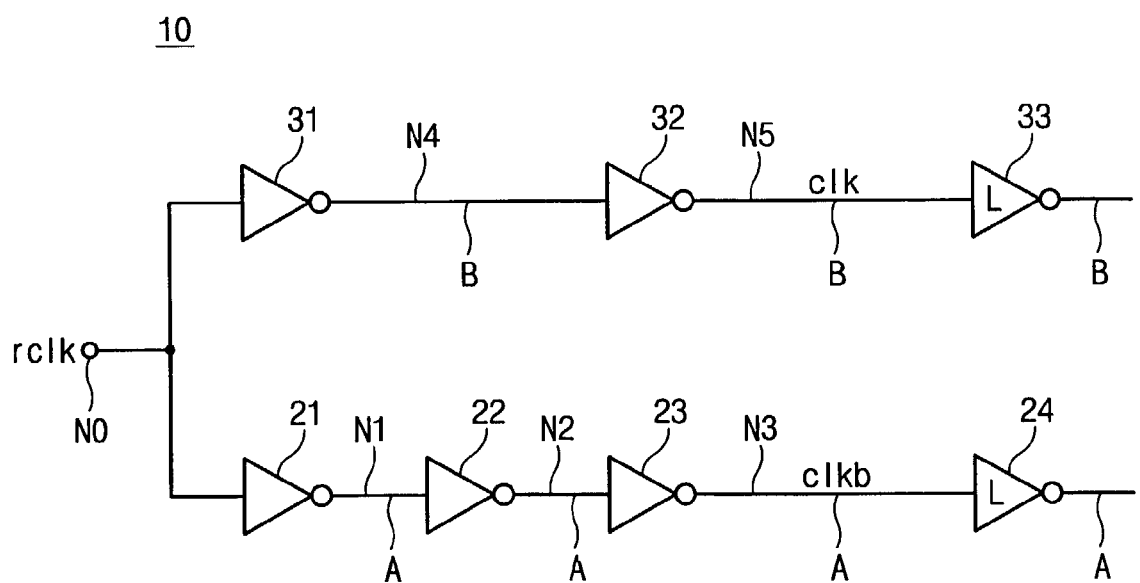
FIG. 1 is a circuit diagram showing a phase splitter circuit according to a prior art.
Figure 2:
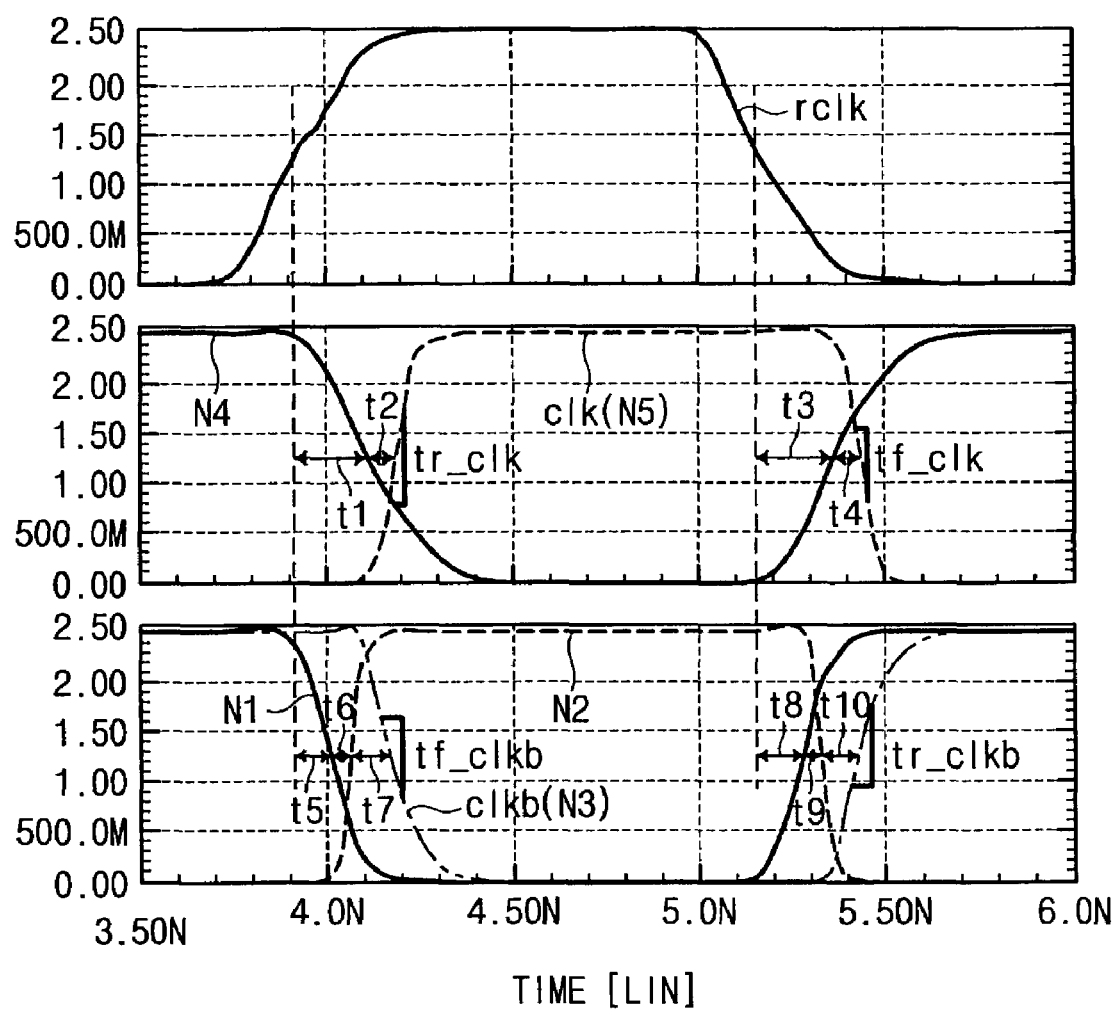
FIG. 2 is a diagram showing waveforms of signals that are varied at each node of the phase splitter circuit as shown in FIG. 1.

As compared with the waveforms shown in FIG. 2, FIG. 5 shows that the rise time tr_clk of the clock signal clk is equal to the fall time tf_clkb of the clock signal clkb, and the fall time tf_clk of the clock signal clk is equal to the rise time tr_clkb of the clock signal clkb. Thus, the phase splitter circuit 100 can be optimized with respect to the PVT variations according to the delay matching method. Furthermore, since it is possible to control the delay times of the inverters 101 and 104, even if the load of the phase splitter circuit 100 is varied, the phase splitter circuit 100 can be flexibly optimized according to the load variations.

Figure 6A:
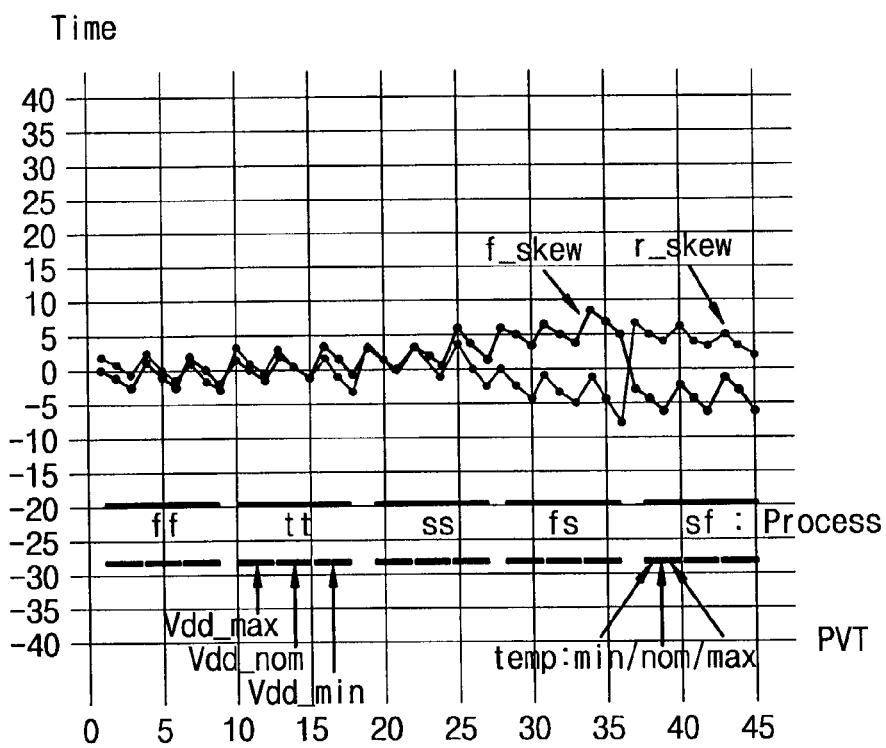
FIGS. 6A and 6B are diagrams showing changes of the characteristics of the phase splitter circuit according to the PVT variations as shown in FIG. 4.
Figure 6B:
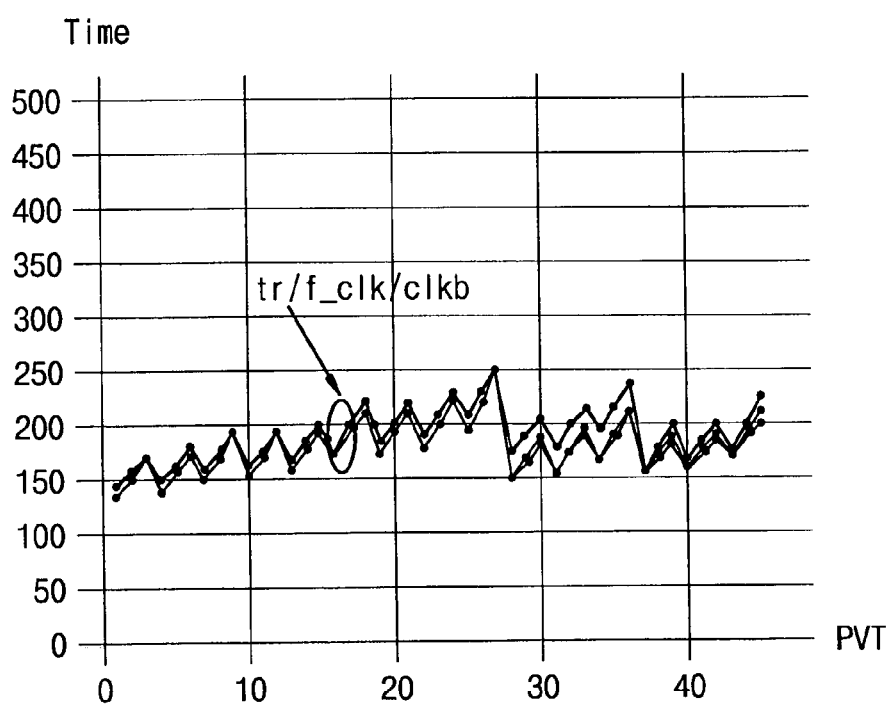
Figure 6C:
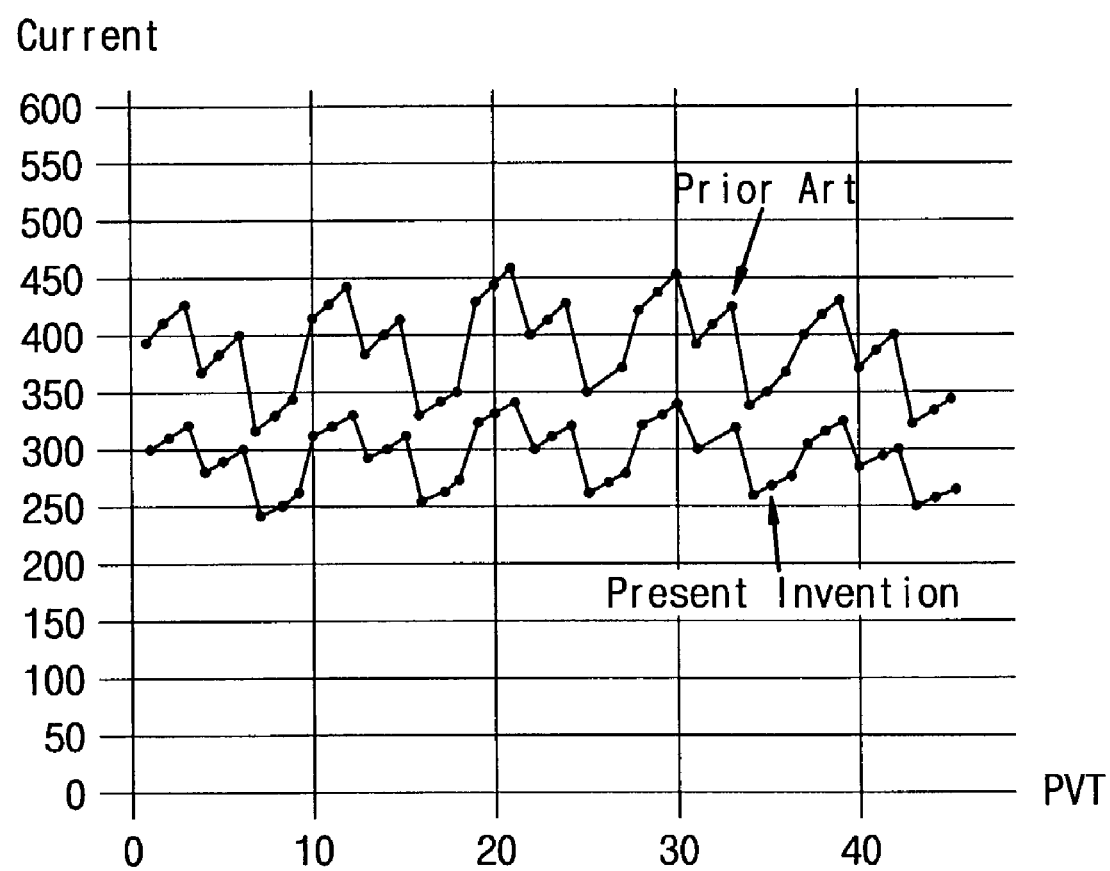
FIG. 6C is a diagram showing variation of current consumed by the phase splitter circuit as shown in FIG. 4.

FIGS. 6A and 6B are diagrams showing changes of the characteristics of the phase splitter circuit according to the PVT variations as shown in FIG. 4. FIG. 6C is a diagram showing variation of current consumed by the phase splitter circuit according to the prior art as shown in FIG. 4.

In FIG. 6A, "ff", "tt", "ss", "fs", and "sf" are different process conditions. That is, "ff" is a process condition of a fast NMOS transistor and a fast PMOS transistor, "tt" is a process condition of a typical NMOS transistor and a typical PMOS transistor, "ss" is a process condition of a slow NMOS transistor and a slow PMOS transistor, "fs" is a process condition of the fast NMOS transistor and the slow PMOS transistor, and "sf" is a process condition of the slow NMOS transistor and the fast PMOS transistor. "Vdd_max" is about 2.626V, "Vdd_nom" is about 2.5V; and "Vdd_min" is about 2.25V. The skews between the clock signals clk and clkb when the clock signal rclk makes a low-to-high or high-to-low transition are denoted as "f_skew" and "r_skew" respectively. As shown in FIG. 6A, when the PVT variations are varied as described above, the skew between the clock signals clk and clkb is controlled within ±9 ps.

Referring to FIG. 6B, "tr/f_clk" is the rise/fall time of the clock signal clk, and "tr/f_clkb" is the rise/fall time of the clock signal clkb. As shown in FIG. 6B, the rise/fall time of the clock signal elk is approximately equal to the rise/fall time of the clock signal clkb. As described above, this results from using the current-starved inverter as the delay element instead of the conventional inverter between the internal nodes N13 and N14, and between the internal nodes N10 and N11.

Figure 3A:
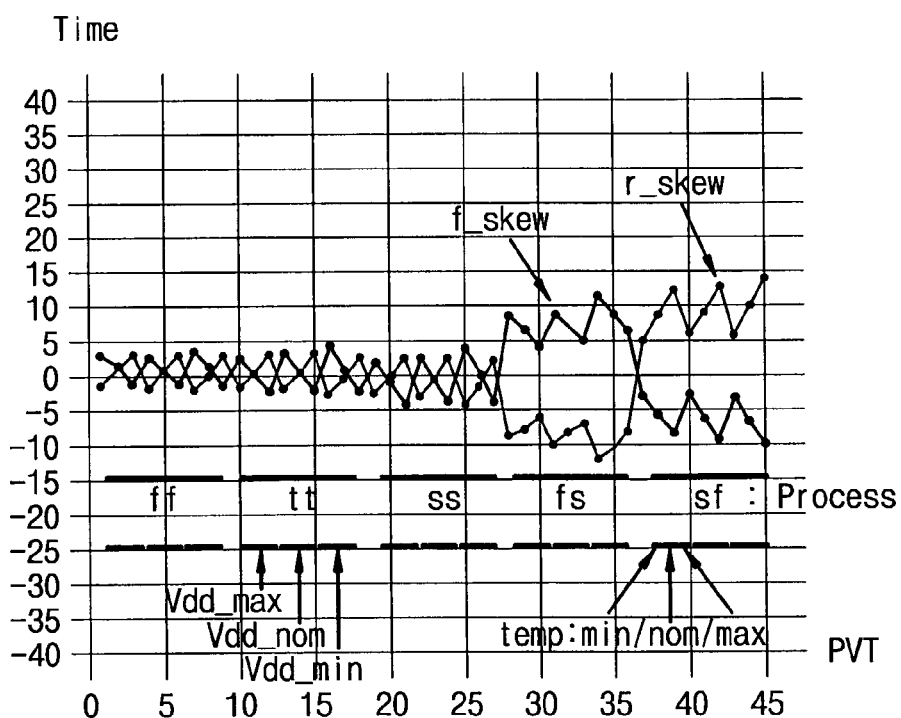
FIGS. 3A and 3B are diagrams showing changes of the characteristics of the phase splitter circuit according to process, voltage, and temperature (PVT) variations as shown in FIG. 1.
Figure 3B:
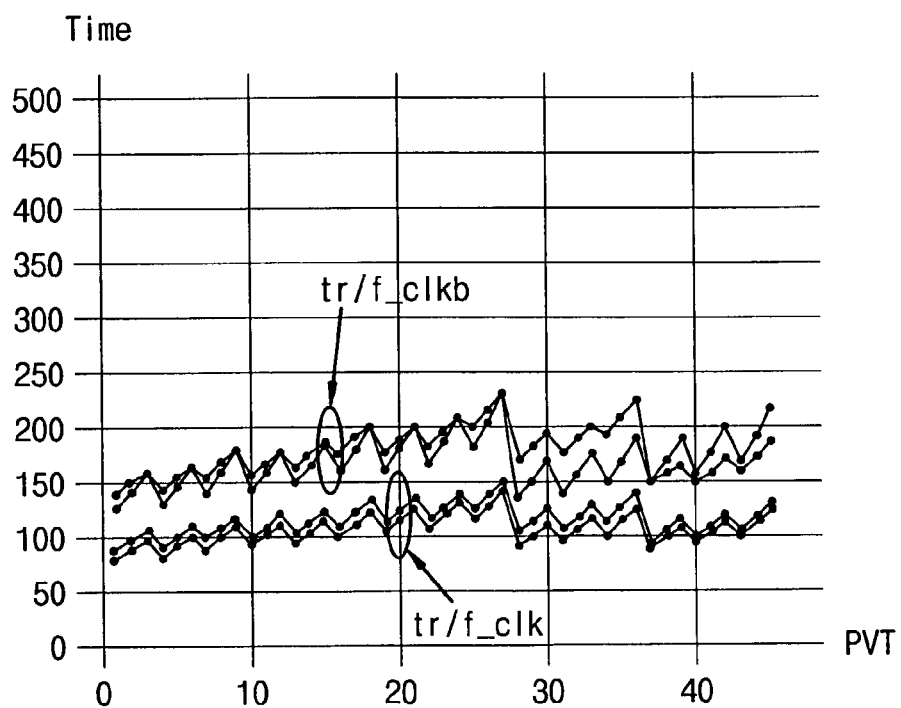
Figure 3C:
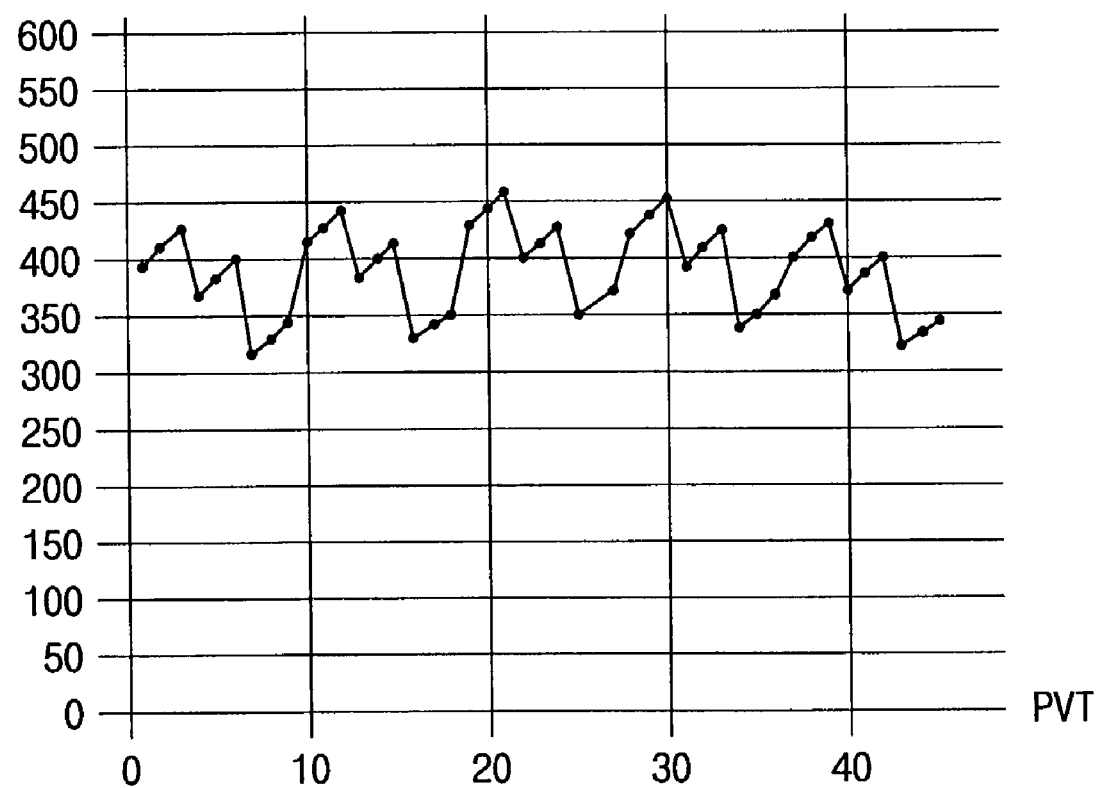
FIG. 3C is a diagram showing variation of current consumed by the phase splitter circuit according to the prior art as shown in FIG. 1.

Referring to FIG. 6C, as a size of the inverter 102 is reduced, charge/discharge currents are decreased more than 20% as compared with those of FIG. 3C. This is because the circuit 100 is structurally advantageous for the delay matching of each element. In other words, unlike the conventional circuit, the circuit 100 needs to excessively increase neither the size of the inverter 102 nor the loading capacitance of the inverter 102.

Figure 8:
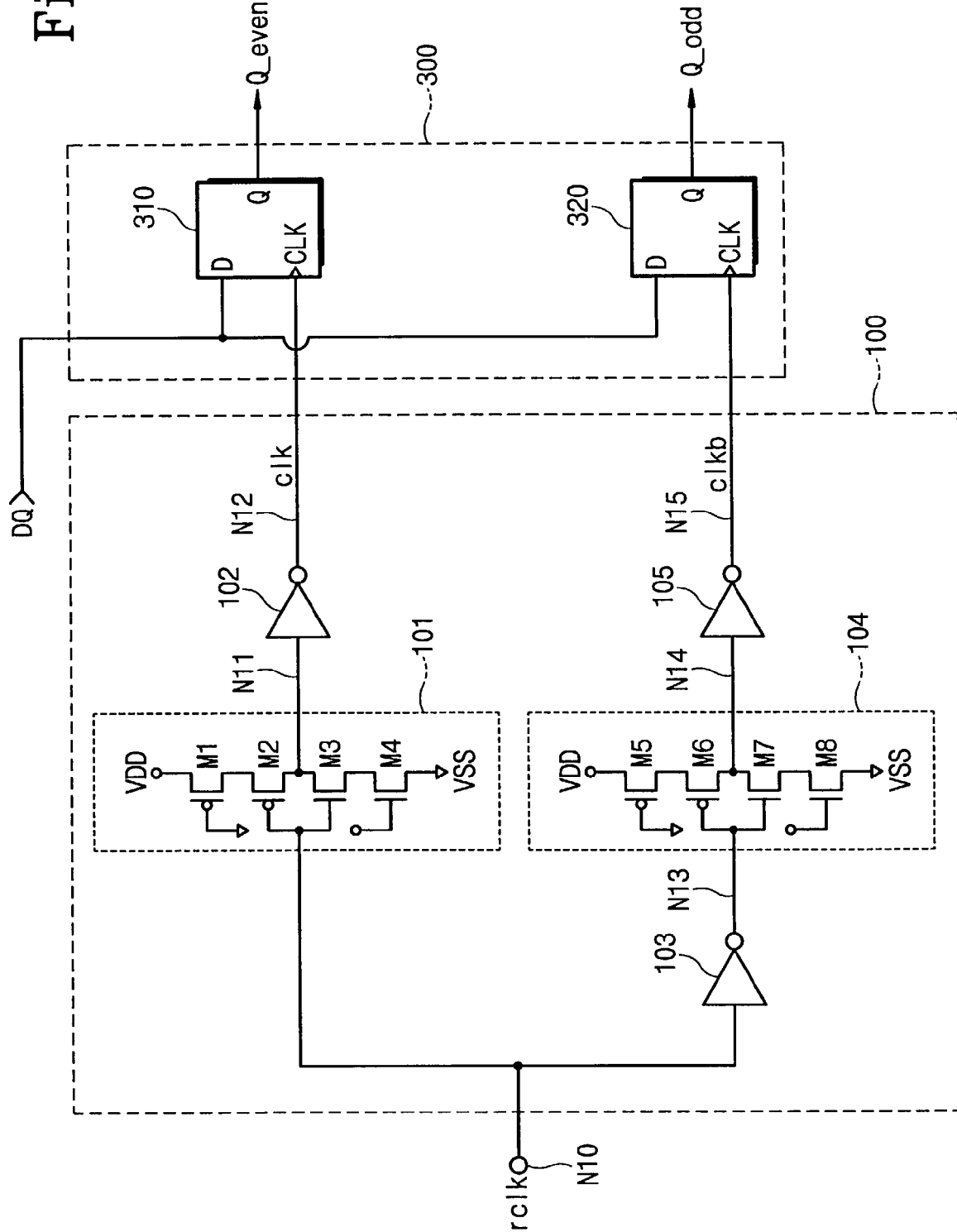
FIGS. 8 and 9 are circuit diagrams showing data input/output circuits synchronized with the output signals of the phase splitter circuit as shown in FIG. 4.
Figure 9:
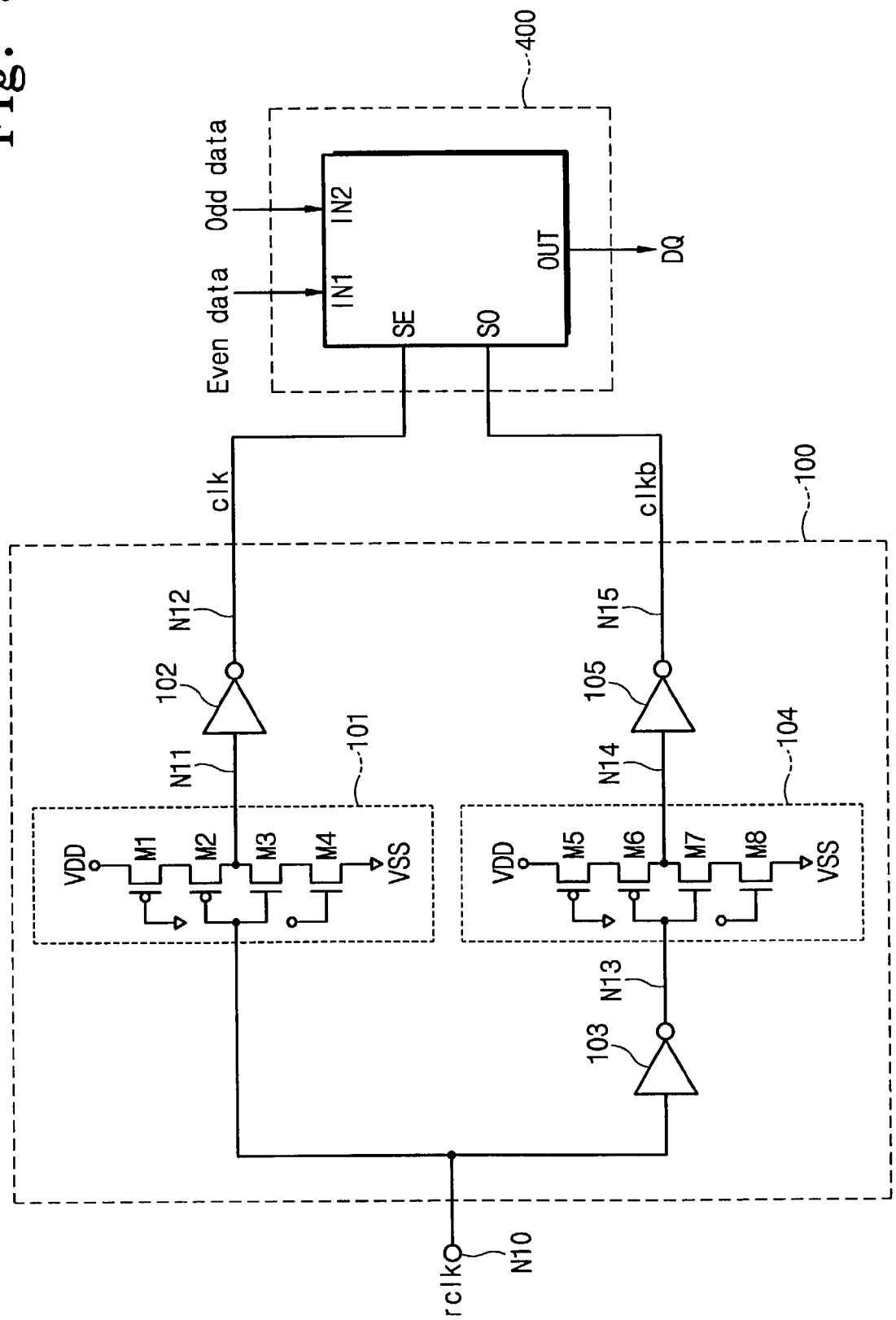

It is certain that the clock signals clk and clkb generated by the phase splitter circuit 100 as shown in FIG. 4 can be used as synchronous signals of input/output interface circuit. For example, a data input/output circuit of a DDR memory is synchronized with the clock signals clk and clkb of the phase splitter circuit 100 to input/output a data stream. In FIGS. 8 and 9, the data input/output circuits are separately illustrated.

To begin with, referring to FIG. 8, a data input circuit 300 corresponds to a single data input pin DQ and includes a first receiver 310 and a second receiver 320. Each of the receivers 310 and 320 comprises a D flip-flop having an input terminal D, a clock terminal CLK, and an output terminal Q. The input terminals D of the first and second receivers 310 and 320 are connected in common to the data input pin DQ. The clock terminal CLK of the first receiver 310 is connected to receive the clock signal clk of the phase splitter circuit 100, and the clock terminal CLK of the second receiver 320 is connected to receive the clock signal clkb of the phase splitter circuit 100. The first receiver 310 is synchronized with a low-high transition of the clock signal elk, and receives even-numbered data of the data stream. The second receiver 320 is synchronized with a low-high transition of the clock signal clkb, and receives odd-numbered data of the data stream.

As can be seen from the above, the data input circuit 300 is influenced by characteristics of the phase splitter circuit 100 that generates the clock signals clk and clkb having a phase difference of 180°. For example, if the transition times of the clock signals clk and clkb (particularly, low-high transition times or rising slopes) are not equal, there arise discrepancies of a setup characteristic and a hold characteristic between the odd and even data paths. As a result, a valid data window is decreased. However, as described above, the phase splitter circuit 100 generates the clock signals clk and clkb of which the transition times (or slopes) are equal. Accordingly, it is possible to highly improve operating characteristics of the data input circuit 300.

As shown in FIG. 9, a data output circuit 400 corresponds to a single data output pin DQ and comprises a 2-to-1 multiplexer. The 2-to-1 multiplexer includes a pair of input terminals IN1 and IN2, a pair of selection terminals SE and SO, and a single output terminal OUT. The input terminal IN1 is connected to receive even data, and the input terminal IN2 is connected to receive odd data. The selection terminal SE is connected to receive the clock signal clk from the phase splitter circuit 100, and the selection terminal SO is connected to receive the clock signal clkb from the phase splitter circuit 100. When the clock signal clk makes a low-to-high transition, the data output circuit 400 outputs the even data. When the clock signal clkb makes the low-to-high transition, the data output circuit 400 outputs the odd data.

Like the data input circuit 300, the data output circuit 400 is considerably influenced by the characteristics of the phase splitter circuit 100 that generates the clock signals clk and clkb having a phase difference of 180°. In particular, the data output circuit 400 is influenced by the difference between the transition slopes of the output signals. In this respect, since the phase splitter circuit 100 generates the clock signals clk and clkb having transition times (or slopes) are equal, the influence of the phase splitter circuit 100 on the data output circuit 400 can be minimized. Thus, it is possible to highly improve the operation characteristic of the data output circuit 400.

While the present invention has been described in connection with description of the preferred embodiment and drawings thereof, it is capable of various changes and modifications without departing from the spirit and scope of the invention.

As explained above, a phase splitter circuit can be optimized with respect to the PVT variations by matching delay times of delay elements (pull-up and pull-down elements) of signal transfer paths. In addition, the disclosed phase splitter circuit can generate output signals clk and clkb having transition times (or slopes) are equal (or approximately equal). That is, the phase splitter circuit 100 may structurally fulfill not only delay matching of each element, but also equality of transition times of the output signals.

What is claimed is:

1. A phase splitter circuit comprising:
   a first signal transfer path for receiving an input signal to generate a first output signal of which phase is equal to that of the input signal; and
   a second signal transfer path for receiving the input signal to generate a second output signal that is an inverted version of the first output signal,
   wherein each of the first and second signal transfer paths includes a plurality of cascaded logic elements, and each of which has pull-up and pull-down delay times,
   wherein when the input signal makes a transition, the sum of pull-down delay times of elements of the first signal transfer path is equal to the sum of pull-down delay times of elements of the second signal transfer path, and the sum of pull-up delay times of elements of the first signal transfer path is equal to the sum of pull-up delay times of elements of the second signal transfer path, and
   wherein a transition time of the first output signal is equal to a transition time of the second output signal.

2. The phase splitter circuit as claimed in claim 1, wherein a rising transition time of the first output signal is equal to a falling transition time of the second output signal.

3. The phase splitter circuit as claimed as in claim 1, wherein a falling transition time of the first output signal is equal to a rising transition time of the second output signal.

4. The phase splitter circuit as claimed as in claim 1, wherein the logic elements of the first signal transfer path include both a CMOS inverter and a current-starved inverter.

5. The phase splitter circuit as claimed as in claim 4, wherein the current-starved inverter comprises first and second PMOS transistors, and first and second NMOS transistors, and wherein the first PMOS transistor, the second PMOS transistor, the first NMOS transistor, and the second NMOS transistor are connected in cascade between first and second power lines in this order.

6. The phase splitter circuit as claimed as in claim 5, wherein the first PMOS transistor and the second NMOS transistor are formed so as to operate as a resistor.

7. The phase splitter circuit as claimed as in claim 5, wherein the second PMOS transistor and the first NMOS transistor are connected in cascade between the first PMOS transistor and the second NMOS transistor to perform an inverting function.

8. The phase splitter circuit as claimed as in claim 1, wherein the logic elements of the second signal transfer path includes both a CMOS inverter and a current-starved inverter.

9. The phase splitter circuit as claimed as in claim 8, wherein the current-starved inverter comprises first and second PMOS transistors, and first and second NMOS transistors, and wherein the first PMOS transistor, the second PMOS transistor, the first NMOS transistor, and the second NMOS transistor are connected in cascade between first and second power lines in this order.

10. The phase splitter circuit as claimed as in claim 9, wherein the first PMOS transistor and the second NMOS transistor are formed so as to operate as a resistor.

11. The phase splitter circuit as claimed as in claim 9, wherein the second PMOS transistor and the first NMOS transistor are connected in cascade between the first PMOS transistor and the second NMOS transistor to perform an inverting function.

12. A phase splitter circuit comprising:
an input node;
a first signal generating unit adapted to receive an input signal from the input node to generate a first output signal having a phase that is equal to that of the input signal; and
a second signal generating unit adapted to receive the input signal from the input node to generate a second output signal, an inverted version of the first output signal,
wherein the first and second signal generating units are optimized such that a transition time of the first output signal is equal to a transition time of the second output signal.

13. The phase splitter circuit as claimed in claim 12, wherein a rising transition time of the first output signal is equal to a falling transition time of the second output signal.

14. The phase splitter circuit as claimed in claim 12, wherein a falling transition time of the first output signal is equal to a rising transition time of the second output signal.

15. The phase splitter circuit as claimed in claim 12, wherein the first and second signal generating units are optimized with respect to process, voltage, and temperature variations using a delay matching method.

16. The phase splitter circuit as claimed in claim 12, wherein the first signal generating unit comprises both a CMOS inverter and a current-starved inverter.

17. The phase splitter circuit as claimed in claim 12, wherein the second signal generating unit comprises both a CMOS inverter and a current-starved inverter.

18. A phase splitter circuit comprising:
an input node;
a first signal generator connected to the input node and adapted to generate a first signal in response to an input signal applied to the input node; and
a second signal generator connected to the input node and adapted to generate, in response to the input signal, a second signal having a phase that is different from that of the first signal,
wherein the phase splitter circuit includes a means for adjusting a transition time of the first signal so that the first signal has the same transition time as that of the second signal.

19. The phase splitter circuit as claimed in claim 18, wherein the first signal generator further comprises at least a pair of inverters that are connected in cascade together, with the means being interposed between the inverters.

20. The phase splitter circuit as claimed in claim 19, wherein the means includes a current-starved inverter adapted to control a delay time by limiting a maximum current flowing therethrough.

21. The phase splitter circuit as claimed in claim 18, wherein the first and second signal generators are optimized with respect to process, voltage, temperature and variations using a delay matching method.

22. The phase splitter circuit as claimed in claim 21, wherein the second signal generator includes a compensating means for compensating delay elements of the first signal, optimized according to a delay matching method, varied by the means.

23. The phase splitter circuit as claimed in claim 22, wherein the compensating means includes a current-starved inverter adapted to control a delay time by limiting a maximum current flowing therethrough.

24. A phase splitter circuit comprising:
an input node;
a first signal generator connected to the input node and adapted to generate a first signal in response to an input signal applied to the input node; and
a second signal generator connected to the input node and adapted to generate, in response to the input node, a second signal having a phase that is different from that of the first signal,
wherein the first signal generator includes a first means for adjusting a transition time of the first signal so that the first signal may have the same transition time as that of the second signal, and
wherein the second signal generator includes a second means for compensating delay elements of the first signal, optimized according to a delay matching method varied by the first means.

25. The phase splitter circuit as claimed in claim 24, wherein the first signal generator further comprises at least a pair of inverters, that are connected in cascade together, with the first means being interposed between the inverters.

26. The phase splitter circuit as claimed in claim 25, wherein the first means includes a current-starved inverter adapted to control a delay time by limiting a maximum current flowing therethrough.

27. The phase splitter circuit as claimed in claim 26, wherein the second signal generator also comprises at least a pair of inverters, and wherein each of the inverters of the first and second signal generators has pull-up and pull-down delay times, and when the input signal makes a transition, the sum of the pull-down delay times of the inverters of the first signal generator is equal to the sum of the pull-down delay times of the inverters of the second signal generator.

28. The phase splitter circuit as claimed in claim 26, wherein the second signal generator also comprises at least a pair of inverters, and wherein each of the inverters of the first and second signal generators has pull-up and pull-down delay times, and when the input signal makes a transition, the sum of the pull-up delay times of the inverters of the first signal generator is equal to the sum of the pull-up delay times of the inverters of the second signal generator.

29. The phase splitter circuit as claimed in claim 24, wherein the second signal generator further comprises at least one inverter that is connected in cascade together with the second means.

30. The phase splitter circuit as claimed in claim 29, wherein the second means comprises at least one current-starved inverter adapted to control a delay time by limiting a maximum current flowing therethrough.

31. The phase splitter circuit as claimed in claim 30, wherein each of the first and second signal generators includes at least a pair of inverters, and wherein each of the inverters of the first and second signal generators has pull-up and pull-down delay times, and when the input signal makes a transition, the sum of the pull-down delay times of the inverters of the first signal generator is equal to the sum of the pull-down delay times of the inverters of the second signal generator.

32. The phase splitter circuit as claimed in claim 30, wherein each of the first and second signal generators includes at least a pair of inverters, and wherein each of the inverters of the first and second signal generators has pull-up and pull-down delay times, and when the input signal makes a transition, the sum of the pull-up delay times of the inverters of the first signal generator is equal to the sum of the pull-up delay times of the inverters of the second signal generator.

33. A phase splitter circuit comprising:
an input node;
a first output node;
a second output node;
a first signal generator adapted to generate a first internal clock signal in response to an external clock signal applied to the input node, wherein the first signal generator includes a first current-starved inverter and a first CMOS inverter that are connected in cascade between the input node and the first output node; and
a second signal generator adapted to generate a second internal clock signal in response to an external clock signal applied to the input node, wherein the second signal generator includes a second CMOS inverter, a second current-starved inverter, and a third CMOS inverter that are connected in cascade between the input node and the second output node.

34. A phase splitter circuit comprising:
an input node;
a first output node;
a second output node;
a first signal generator adapted to generate a first internal clock signal in response to an external clock signal applied to the input node, wherein the first signal generator includes a first current-starved inverter and a first CMOS inverter that are connected in cascade between the input node and the first output node; and
a second signal generator adapted to generate a second internal clock signal in response to an external clock signal applied to the input node, wherein the second signal generator includes a second CMOS inverter, a second current-starved inverter, and a third CMOS inverter that are connected in cascade between the input node and the second output node,
wherein each of the first and second current-starved inverters includes first and second PMOS transistors, and first and second NMOS transistors, and
wherein in each of the first and second current-starved invertors, the first PMOS transistor, the second PMOS transistor, the first NMOS transistor, and the second NMOS transistor are connected in cascade between first and second power lines in this order.

35. The phase splitter circuit as claimed in claim 34, wherein the first PMOS transistor and the second NMOS transistor of each of the first and second current-starved invertors are formed so as to operate as a resistor.

36. The phase splitter circuit as claimed in claim 34, wherein in each of the first and second current-starved inventors, the second PMOS transistor and the first NMOS transistor connected in cascade between the first PMOS transistor and the second NMOS transistor perform an inverting function.

37. A phase splitter circuit comprising:
an input node;
a first output node;
a second output node;
a first signal generator adapted to generate a first internal clock signal in response to an external clock signal applied to the input node, wherein the first signal generator includes a first current-starved inverter and a first CMOS inverter that are connected in cascade between the input node and the first output node; and
a second signal generator adapted to generate a second internal clock signal in response to an external clock signal applied to the input node, wherein the second signal generator includes a second CMOS inverter, a second current-starved inverter, and a third CMOS inverter that are connected in cascade between the input node and the second output node,
wherein each of the first and second current-starved inverters includes a first resistor, a PMOS transistor, a NMOS transistor, and a second resistor, and
wherein in each of the first and second current-starved inventors, the first resistor, the PMOS transistor, the NMOS transistor, and the second resistor are connected in cascade between first and second power lines in this order.

38. The phase splitter circuit as claimed in claim 37, wherein in each of the first and second current-starved inventors the PMOS transistor and the NMOS transistor connected in cascade between the first and second resistors perform an inverting function.

* * * * *